United States Patent
Shimura et al.

(10) Patent No.: US 8,669,483 B2
(45) Date of Patent: Mar. 11, 2014

(54) FLEXIBLE CABLE AND TRANSMISSION SYSTEM

(75) Inventors: Takuma Shimura, Kanagawa (JP); Takashi Akita, Hyogo (JP); Osamu Shibata, Hyogo (JP)

(73) Assignee: Panasonic Corporation, Osaka (JP)

( * ) Notice: Subject to any disclaimer, the term of this patent is extended or adjusted under 35 U.S.C. 154(b) by 210 days.

(21) Appl. No.: 13/260,816

(22) PCT Filed: Mar. 30, 2010

(86) PCT No.: PCT/JP2010/002318
§ 371 (c)(1),
(2), (4) Date: Sep. 28, 2011

(87) PCT Pub. No.: WO2010/116684
PCT Pub. Date: Oct. 14, 2010

(65) Prior Publication Data
US 2012/0020416 A1    Jan. 26, 2012

(30) Foreign Application Priority Data

Mar. 30, 2009  (JP) ................. 2009-080964

(51) Int. Cl.
*H05K 1/02* (2006.01)
(52) U.S. Cl.
USPC ....... 174/350; 174/32; 174/110 R; 174/117 F
(58) Field of Classification Search
USPC ............ 174/350, 32, 33, 68.1, 250, 251, 268, 174/117 F, 117 FF; 375/257
See application file for complete search history.

(56) References Cited

U.S. PATENT DOCUMENTS 5,455,383 A * 10/1995 Tanaka .................... 174/117 FF
(Continued)

FOREIGN PATENT DOCUMENTS

| CN | 1560877 A | 1/2005 |
| JP | 2002-117726 A | 4/2002 |

(Continued)

OTHER PUBLICATIONS

CN Office Action for 201080015541.1, Aug. 2, 2012.
(Continued)

*Primary Examiner* — Angel R Estrada
(74) *Attorney, Agent, or Firm* — RatnerPrestia

(57) ABSTRACT

A flexible cable is provided in which a transmission characteristic can be ensured in a high frequency band, and electromagnetic noises can be suppressed. A flexible cable 11 includes a sheet-like base member (dielectric substance) 1; an adhesive (dielectric substance) 2 which bonds the base member 1 to a cover member (dielectric substance) 3; a shield member 4 which covers the cover member 3 and is bonded or printed to the cover member 3 to suppress electromagnetic noises to be radiated; and a top coating member 5 which covers the shield member 4 to protect the shield member 4. The flexible cable 11 has a differential signal wire group 7 including differential signal wires 6 through which differential signals pass and guard ground wires 9a which prevent the interference from other differential signals; a low-speed signal wire 8 through which a low-speed signal passes; a ground wire 9 used as a ground; and a shield ground wire 10 which is adapted to allow the electric potential of the shield member 4 to be identical to the electric potential of the ground, all of which are provided in the adhesive 2. The differential signal wires 6 are not covered with the shield member 4.

8 Claims, 13 Drawing Sheets

(56) References Cited

U.S. PATENT DOCUMENTS

| | | | | |
|---|---|---|---|---|
| 6,635,827 | B2 * | 10/2003 | Yosomiya | 174/117 FF |
| 7,399,929 | B2 * | 7/2008 | Ueno et al. | 174/117 FF |
| 7,807,927 | B2 * | 10/2010 | Yeh | 174/117 FF |
| 8,110,744 | B2 * | 2/2012 | Wong et al. | 174/117 F |
| 8,338,709 | B2 * | 12/2012 | Kodama et al. | 174/117 F |
| 2008/0029299 | A1 | 2/2008 | Hakamada | |

FOREIGN PATENT DOCUMENTS

| | | |
|---|---|---|
| JP | 2005-302315 A | 10/2005 |
| JP | 2008-041454 A | 2/2008 |

OTHER PUBLICATIONS

International Search Report for PCT/JP2010/002318, Jun. 29, 2010.

* cited by examiner

FLEXIBLE CABLE AND TRANSMISSION SYSTEM

This application is a U.S. National Phase application of PCT International Application No. PCT/JP2010/002318.

TECHNICAL FIELD

The present invention relates to a flexible cable of which the transmission characteristic and the electromagnetic noise characteristic are considered, and a transmission system.

BACKGROUND ART

FIG. 14 is a cross sectional view of a conventional flexible cable. In this specification, a word of "flexible cable" is used in meanings of both of FPC (Flexible Printed Circuits) and FFC (Flexible Flat Cable).

The flexible cable 36 shown in FIG. 14 is an FPC (Flexible printed Circuits). The flexible cable 36 includes a flexible sheet-like base member (a dielectric substance) 1, an adhesive (a dielectric substance) 2 which bonds the base member 1 to a cover member (a dielectric substance) 3, a shield member 4 which covers the cover member 3 and is bonded or printed on the cover member 3 to suppress electromagnetic noises to be radiated, and a top coating member 5 which covers the shield member 4 to protect the shield member 4. The adhesive (the dielectric substance) 2 is provided therein with differential signal wires 6 through which differential signals pass, a low-speed signal wire 8 through which low-speed signals pass, ground wires 9 used as the ground and shield ground wires 10 which cause the electric potential of the shield member 4 to be identical to the electric potential of the ground.

Here, the shield member 4 is provided over the entirety of the flexible cable 36 so as to effectively suppress electromagnetic noises to be radiated (see Patent Document 1).

PRIOR ART DOCUMENTS

Patent Documents

Patent Document 1: JP-A-2002-117726

SUMMARY OF INVENTION

Problems that the Invention is to Solve

However, in a conventional flexible cable, a problem that a transmission characteristic of a signal wire covered with a shield member is markedly deteriorated in a high frequency band may arise.

In addition, while, also in a printed board or the like, an entirety including an electromagnetic noise source is sometimes covered with a shield member such as a shield case or the like so as to suppress electromagnetic noises to be radiated, the shield member and the signal wire are away from one another, so that the transmission characteristic of the signal wire is not markedly deteriorated. However, since the flexible cable is formed in a thin sheet, the distance between the shield member and the signal wire is short, so that deterioration of the transmission characteristic of the signal wire covered with the shield member in the high frequency band has been outstanding.

This invention is made to solve the above described problems, and the purpose of the invention is to provide a flexible cable which is configured such that a signal wire through which a signal requiring ensuring of a transmission characteristic in a high frequency band passes, is not covered with a shield member, but a signal wire through which a signal such as a clock signal or the like to be an electromagnetic noise passes, is covered with a shield member so as to make it possible to satisfy both of ensuring of the transmission characteristic in the high frequency band and suppression of electromagnetic noises to be radiated.

In addition, in the above flexible cable, transmission speeds of signals are differentiated between the signal wire which is covered with the shield member and the signal wire which is not covered with the shield member so that timings of the signals arriving at an IC as a signal reception section are deviated from one another. Consequently, there is a possibility that the signals are not accurately received by the IC as the signal reception section. The additional purpose of the invention is to provide a transmission system having a unit of adjusting a timing of a signal arriving at an IC as a signal reception section so as to allow the IC as the signal reception section to accurately receive the signal.

Means for Solving the Problems

A flexible cable of the present invention includes a sheet-like dielectric substance, first and second conductive wire groups provided in the sheet-like dielectric substance, and a sheet-like shield member that is laminated on the sheet-like dielectric substance so as to cover the first conductive wire group and so as not to cover the second conductive wire group.

Also, a transmission system of the invention includes a signal transmission section that transmits a differential signal, a signal reception section that receives a differential signal, and a flexible cable that connects the signal transmission section to the signal reception section, and the flexible cable includes a sheet-like dielectric substance, first and second conductive wire groups provided in the sheet-like dielectric substance, and a sheet-like shield member that is laminated on the sheet-like dielectric substance so as to cover the first conductive wire group and so as not to cover the second conductive wire group.

Advantage of the Invention

In each of the flexible cable and the transmission system according to the invention, a signal wire through which a signal requiring ensuring of a transmission characteristic in a high frequency band passes, is not covered with a shield member, and a signal wire through which a signal to be an electromagnetic noise source passes, is covered with a shield member. Consequently, the transmission characteristic in the high frequency band can be ensured and radiation of electromagnetic noises can be suppressed.

MODE FOR CARRYING OUT THE INVENTION

A flexible cable according to embodiments of the invention will be described below with reference to accompanying drawings.

First Embodiment

Figure 1:
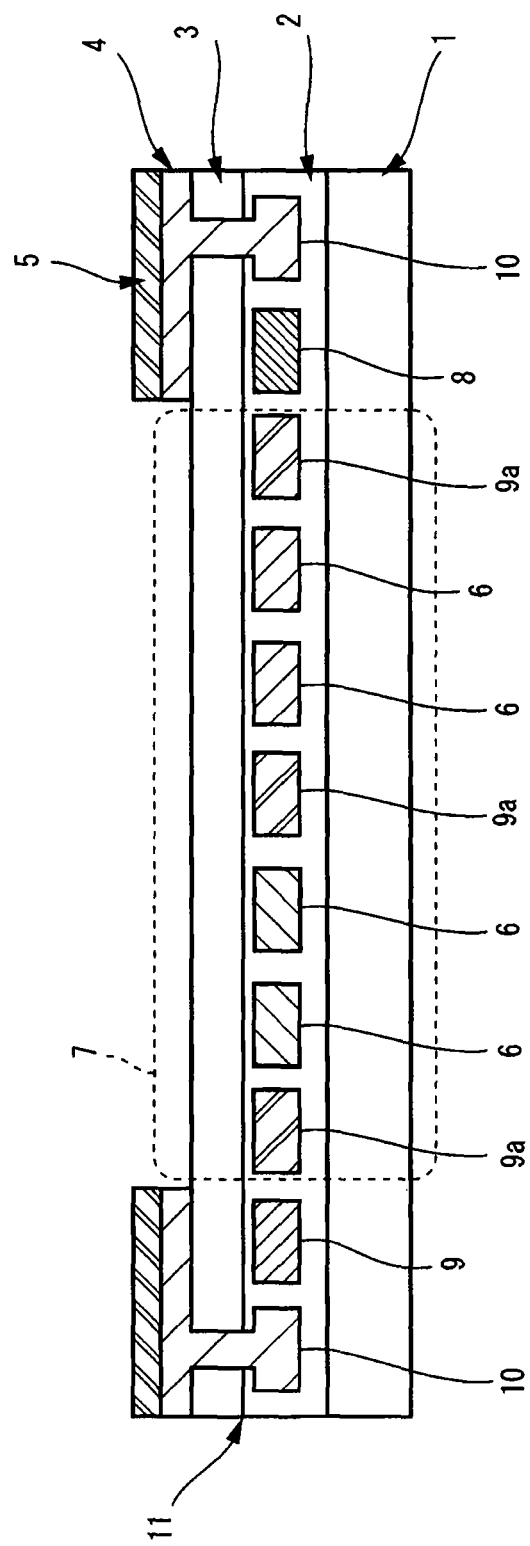
FIG. 1 is a cross sectional view showing a flexible cable according to a first embodiment of the invention.
Figure 2:
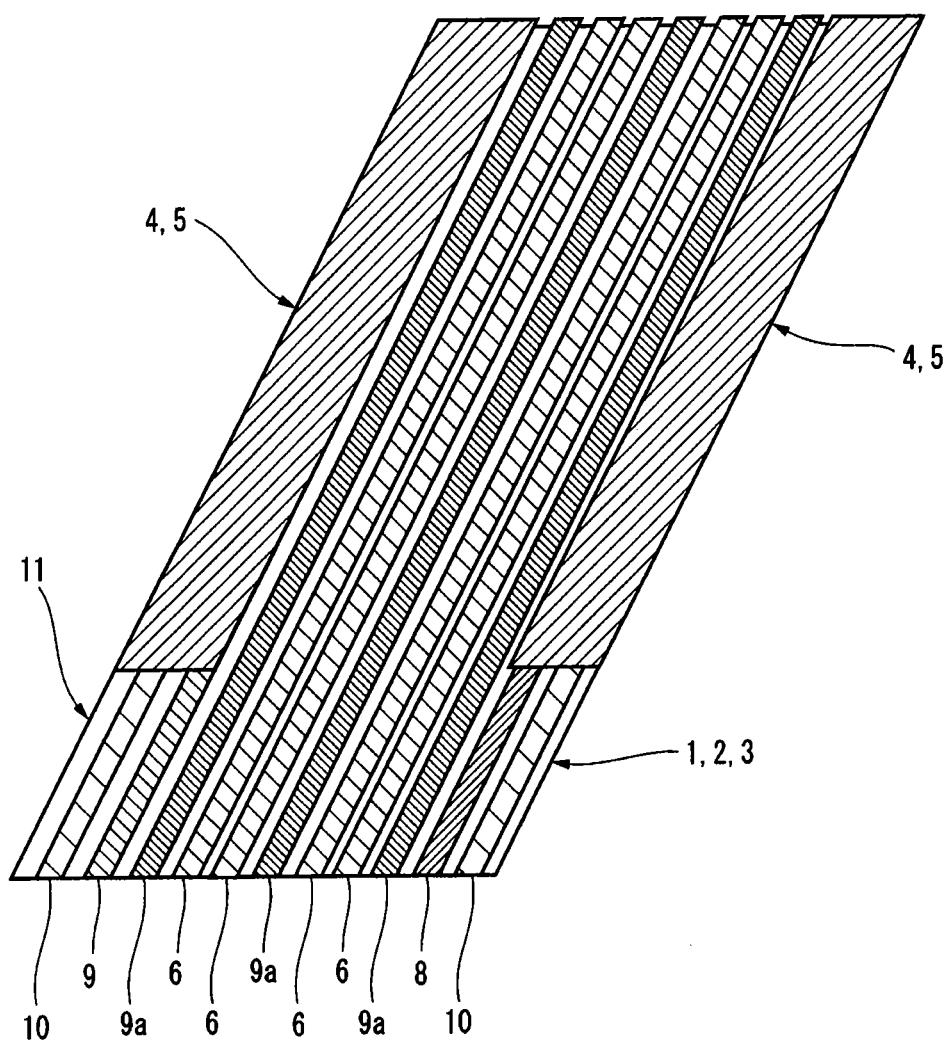
FIG. 2 is a top view showing the flexible cable according to the first embodiment of the invention.

A flexible cable according to a first embodiment of the invention is described while schematically indicating a cross sectional view in FIG. 1 and a top view in FIG. 2.

In FIG. 1, a flexible cable 11 which is an FPC (Flexible Printed Circuits) includes a sheet-like base member (a dielectric substance) 1 made of a flexible material, an adhesive (a dielectric substance) 2 which bonds the base member 1 to a cover member (a dielectric substance) 3, a shield member 4 which covers the cover member 3 and is bonded or printed to the cover member 3 to suppress electromagnetic noises to be radiated, and a top coating member 5 which covers the shield member 4 to protect the shield member 4.

In addition, the flexible cable 11 has a differential signal wire group 7 including differential signal wires 6 through which differential signals pass and guard ground wires 9a which prevent the interference from other differential signals, a low-speed signal wire 8 through which low-speed signals pass, a ground wire 9 used as the ground, and a shield ground wire 10 which is adapted to allow the electric potential of the shield member 4 to be identical to the electric potential of the ground, all of which are provided in the adhesive 2.

The shield ground wire 10 is adapted to allow the electric potentials of the shield member 4 and the ground wire 10 to be identical to each other, and the shield member 4 and the ground wire 10 are connected to each other with a conductive adhesive, a conductive through-hole, a solder or the like.

The characteristics of the flexible cable 11 having the above configuration are described with reference to FIG. 3.

First, in the embodiment, the differential signal wires 6 are not covered with the shield member 4. This is because that the transmission characteristic of wiring of the flexible cable 11 is markedly varied depending on presence or absence of the shield member 4.

Figure 3:
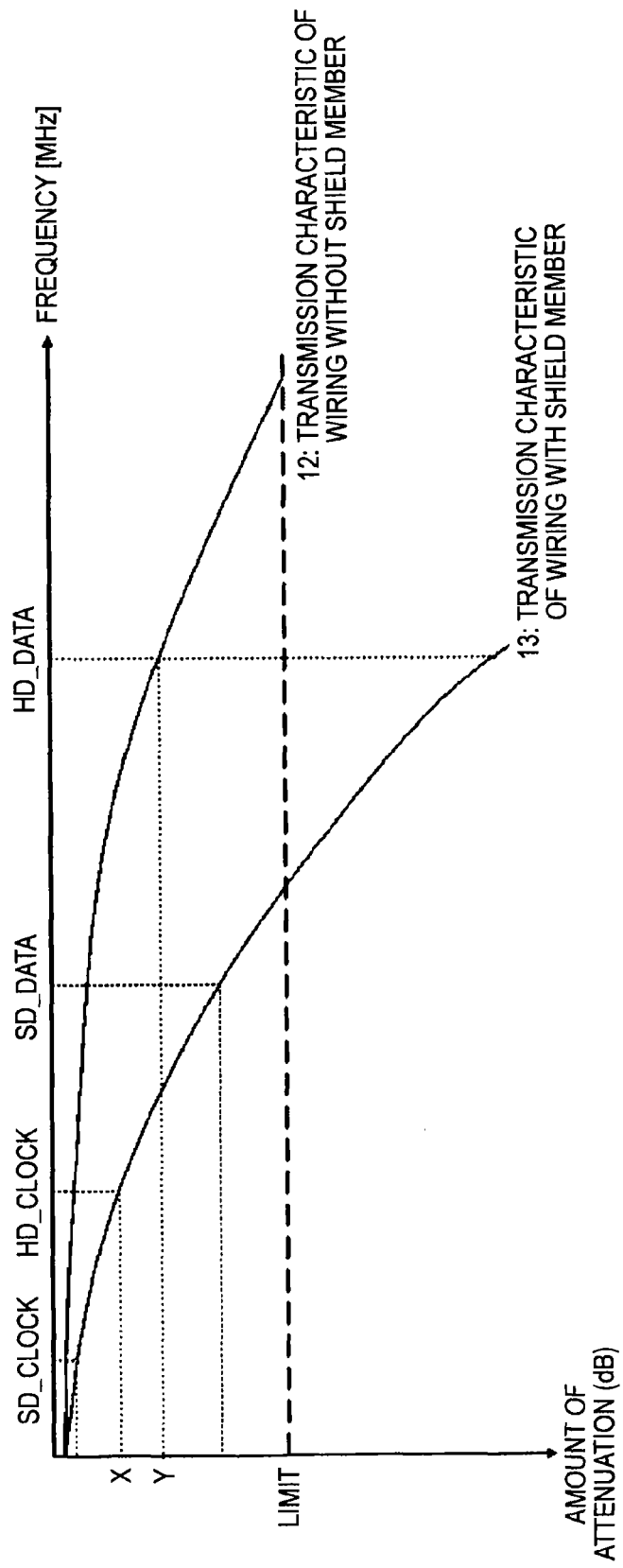
FIG. 3 is a graph showing a relationship between a shield member and a transmission characteristic.

FIG. 3 schematically shows a transmission characteristic 12 of wiring without a shield member and a transmission characteristic 13 of wiring with a shield member.

The transmission characteristic 13 of the wiring and the shield member is markedly deteriorated in a high frequency band as compared to the transmission characteristic 12 of the wiring without the shield member.

This is because that a distance between the shield member used in the flexible cable and the signal wire is short, and an effectiveness of the shield member as the ground is low.

In a conventional transmission system with the use of a flexible cable, since a frequency band of a signal to be transmitted is a band of a comparatively low frequency such as, for example, Standard Definition picture data (SD_data), the transmission system operates without a trouble even when the transmission characteristic is deteriorated.

However, in the embodiment, the frequency band of a signal to be transmitted is a band of a higher frequency such as, for example, High Definition picture data (HD_data). Therefore, when the transmission characteristic is deteriorated, a shape of the transmitted signal is deformed, and thereby the transmission system does not accurately operate.

Therefore, the flexible cable of the embodiment is configured such that the differential signal wire group 7 is not covered with the shield member 4. Accordingly, the differential signal wire group 7 can ensure the adequate transmission characteristic even in the high frequency band of signals passing through the signal wires.

In addition, the low-speed signal wire 8, a power source wire or the ground wire 9, which is other signal wires not included in the differential signal wire group 7, is configured to be covered with the shield member 4. This is because that a signal used in low-speed communication such as I2C passing through the low-speed signal wire 8, a signal for controlling or also a power source to be supplied to an IC may become a source of electromagnetic noises. With this configuration, it is possible to suppress electromagnetic noises to be radiated.

Thus, in accordance with the flexible cable 11 according to the first embodiment of the invention, the flexible cable 11 is configured such that the differential signal wire group 7 is not covered with the shield member 4 and the signal wires other than the above, such as the low-speed signal wire 8 and the like are covered with the shield member 4 so that it is possible to satisfy both of ensuring of a transmission characteristic in a high frequency band and suppression of electromagnetic noises to be radiated.

Meanwhile, regarding the wiring in the flexible cable 11, in addition to the wires having the number shown in the drawings, a differential signal wire or a guard ground wire is provided on a region not covered with the shield member 4, and the low-speed signal wire, the power source wire, the ground wire or the like is provided on a region covered with the shield member 4. However, in the above description, the configuration is not indicated in the drawings, and only things relating to allocation of wires, which is the advantage of the invention, are indicated. The guard ground wire 9a is not necessarily included in the differential signal wire group 7.

Second Embodiment

Figure 4:
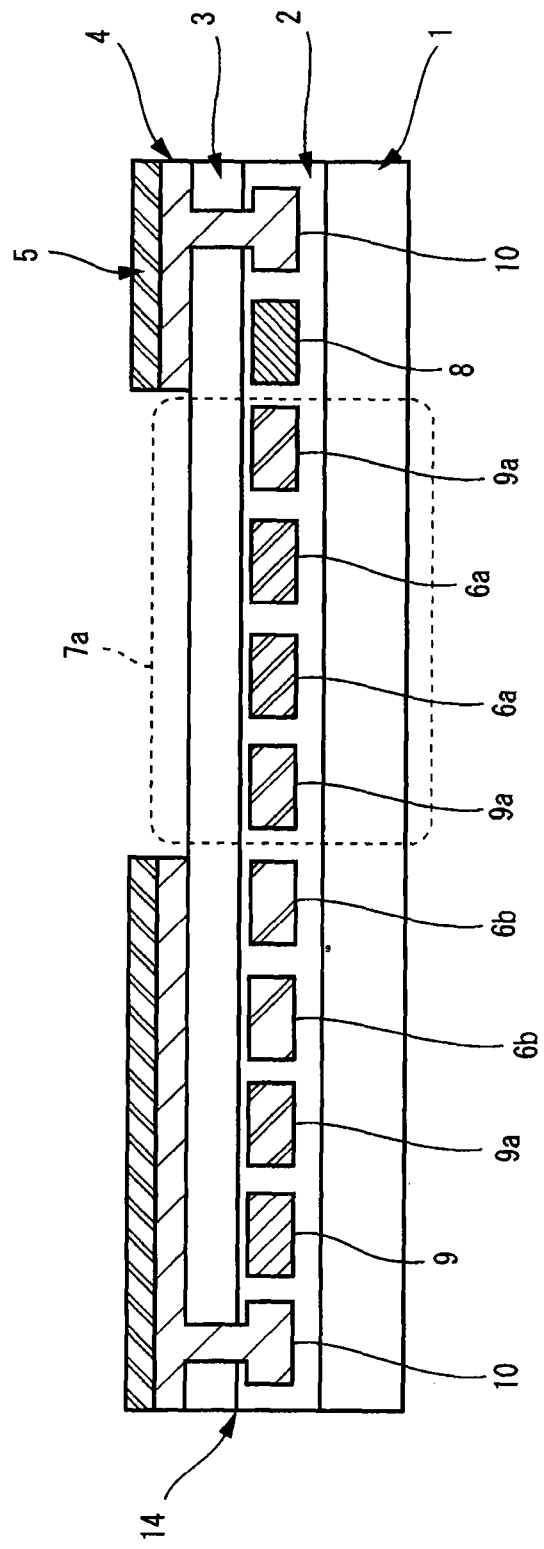
FIG. 4 is a cross sectional view showing a flexible cable according to a second embodiment of the invention.
Figure 5:
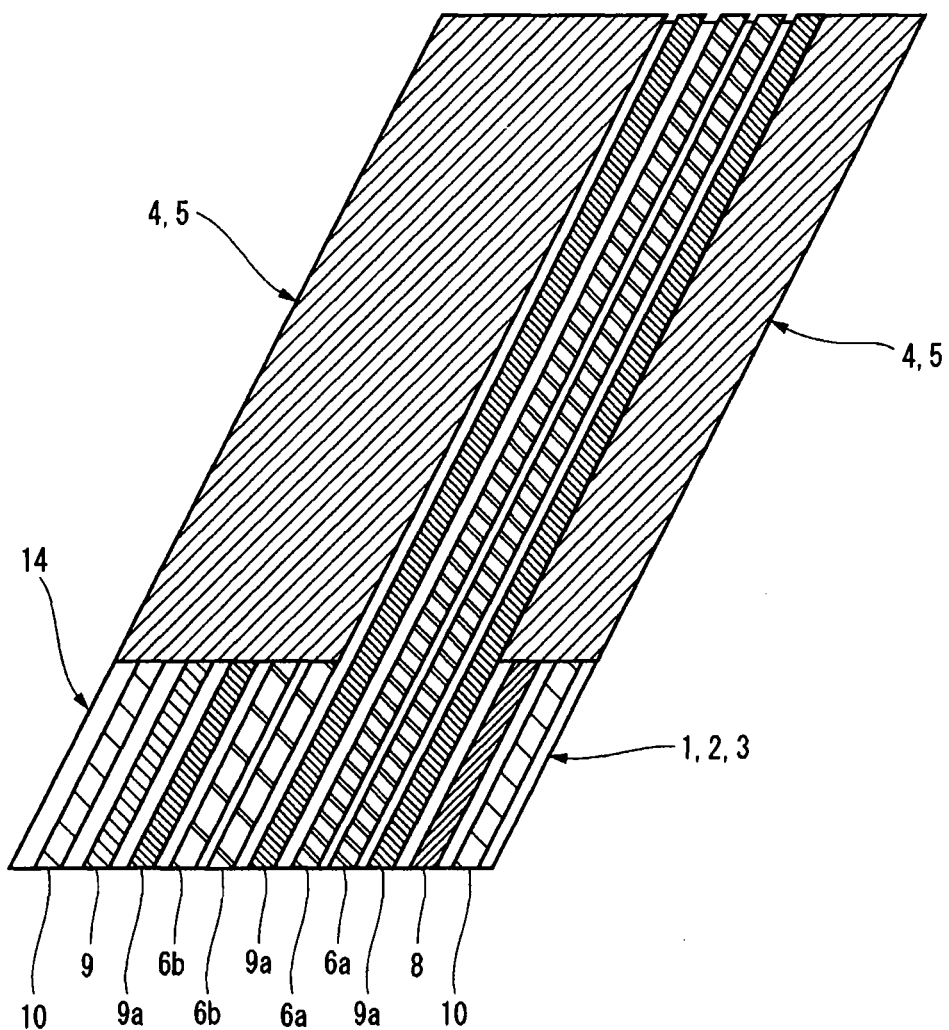
FIG. 5 is a top view showing the flexible cable according to the second embodiment of the invention.

Next, a flexible cable 14 according to a second embodiment of the invention is described while schematically indicating a cross sectional view in FIG. 4 and a top view in FIG. 5.

In FIG. 4, a kind of each signal wire covered with the shield member 4 and the top coating member 5 of the flexible cable 14 is different from that of the flexible cable according to the first embodiment.

In the first embodiment, the entirety of the differential signal wire group 7 is not covered with the shield member 4 and the top coating member 5. Contrary to the above, in this embodiment, the differential signal wire group 7 is divided differential data signal wires 6a through which data signals pass and differential clock signal wires 6b through which clock signals pass, and wires other than a differential signal wire group 7a including the differential data signal wires 6a through which data signals pass and the guard ground wire 9a, are covered with the shield member 4 and the top coating member 5.

Characteristics of the flexible cable 14 having the above configuration is described below with reference to FIG. 6.

The description is made by assuming that an LVDS (Low Voltage Differential Signaling) is used as the transmission method for the flexible cable 14 of this embodiment.

Since signals having identical waveforms and phases deviated 180 degrees from each other pass through the differential data signal wires 6a through which data signals pass and differential clock signal wires 6b through which clock signals pass, the two signal wires are placed to be adjacent to each other.

Figure 6:
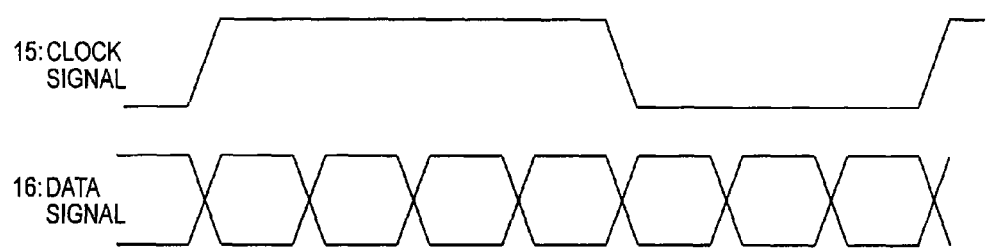
FIG. 6 is a diagram showing timings of a clock and data in an LVDS.

In addition, the LVDS transmits, for example, sevel data signals 16 in one cycle of a clock signal 15 as shown in FIG. 6. Therefore, in a case where the clock signal is set to, for example, 75 MHz, each of the data signals becomes 525 Mbps in maximum (262.5 MHz in maximum) so that the data signal becomes a high speed signal as compared to the clock signal.

Further, since a signal periodically repeating High and Low states becomes an electromagnetic noise source, the clock signal becomes a signal of an electromagnetic noise source.

Accordingly, by confguring the differential data signal wires 6a through which data signals pass to be not covered with the shield member 4, it is possible to ensure an adequate transmission characteristic to a high frequency band, and by configuring the differential clock signal wires 6b through which clock signals pass to be covered with the shield member 4, it is possible to more effectively suppress electromagnetic noises to be radiated.

Thus, in accorance with the flexible cable 14 according to the second embodiment of the invention, the flexible cable 14 is configured such that the differential clock signals 6b through which clock signals pass are covered with the shield member 4 and the differential data signal wires 6a through which data signals pass are not covered with the shield member 4. Consequently, it is possible to satisfy both of the effective suppressing of electromagnetic noises to be radiated and ensuring of the adequate transmission characteristic in the high frequency band.

Meanwhile, regarding the wiring in the flexible cable 14 of this embodiment, in addition to the wires having the number shown in the drawings, the differential signal wire of the guard ground is provided on a region not covered with the shield member 4, and the low-speed signal wire, the power soruce wire, the ground wire or the like is provided on a region covered with the shield member 4. However, in the above description, the configuration is not indicated in the drawings, and only things relating to allocation of wires, which is the advantage of the invention, are indicated. The guard ground wire 9a is not necessarily included in the differential signal wire group 7.

Meanwhile, the description of the flexible cable 14 according to the embodiment is made based on the example having the configuration in which the transmission is performed by using the LVDS as the transmission method. However, other than that, a configuration in which the transmission is performed by a differential transmission method such as a miniLVDS, a BusLVDS, an RSDS, a TMDS or the like can be similarly practiced.

Next, a transmission system having a timing adjusting unit is described with reference to FIG. 7.

Figure 7:
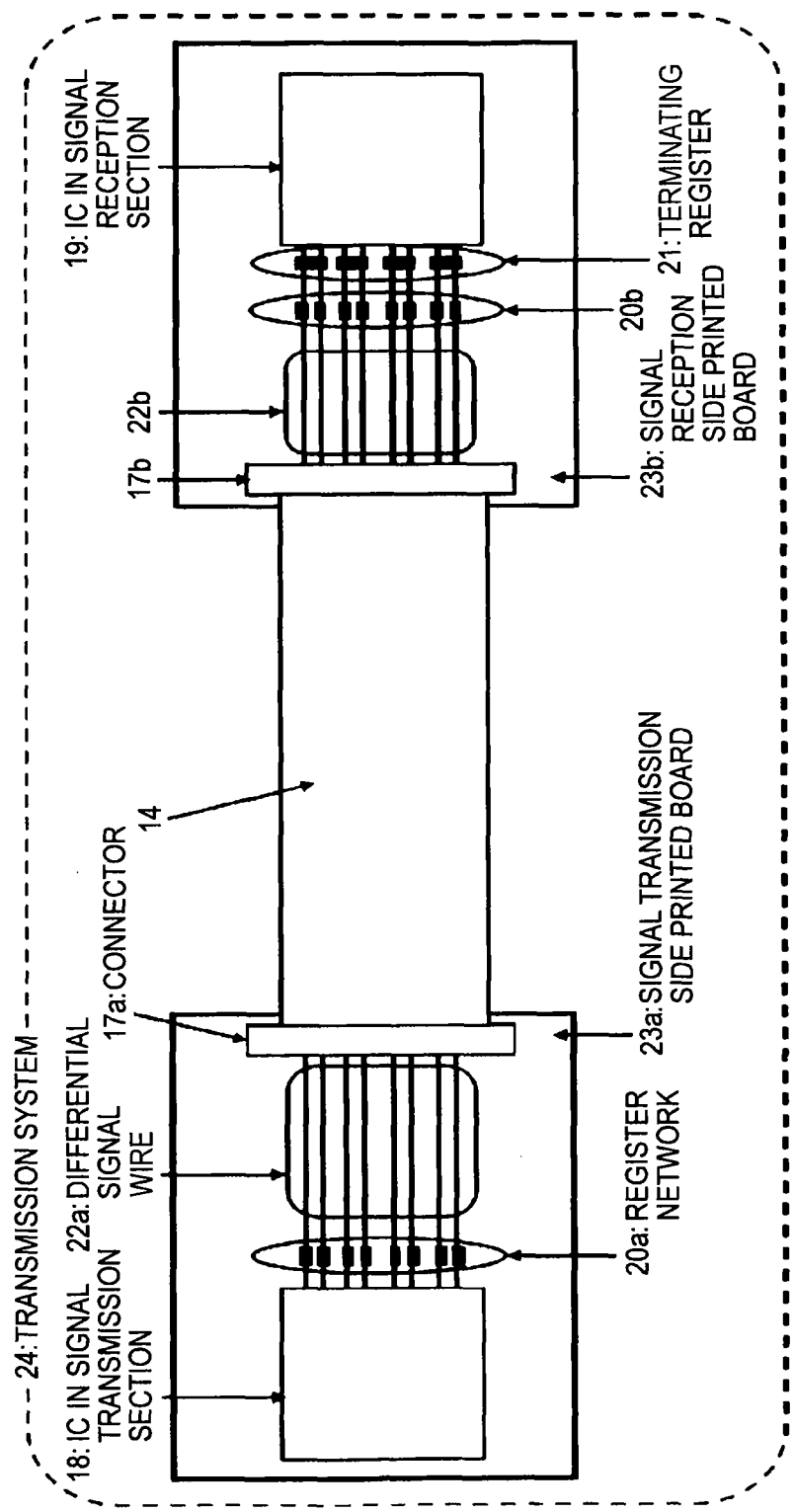
FIG. 7 is a configuration view showing a transmission system according to the second embodiment of the invention.

In FIG. 7, a tranmission system 24 includes a transmission side printed board 23a having an IC 18 as a signal transmission section, an impedance network 20 as an adjusting unit, a differential signal wire 22a and a connector 17a, and a reception side printed board 23b having a connector 17b, a differential signal wire 22b, the impedance network 20, a terminating resistor 21 and an IC 19 as a signal reception section. The transmission system 24 is configured such that the transmission side printed board 23a and the reception side printed board 23b are coupled to each other with the flexible cable 14.

Figure 8:
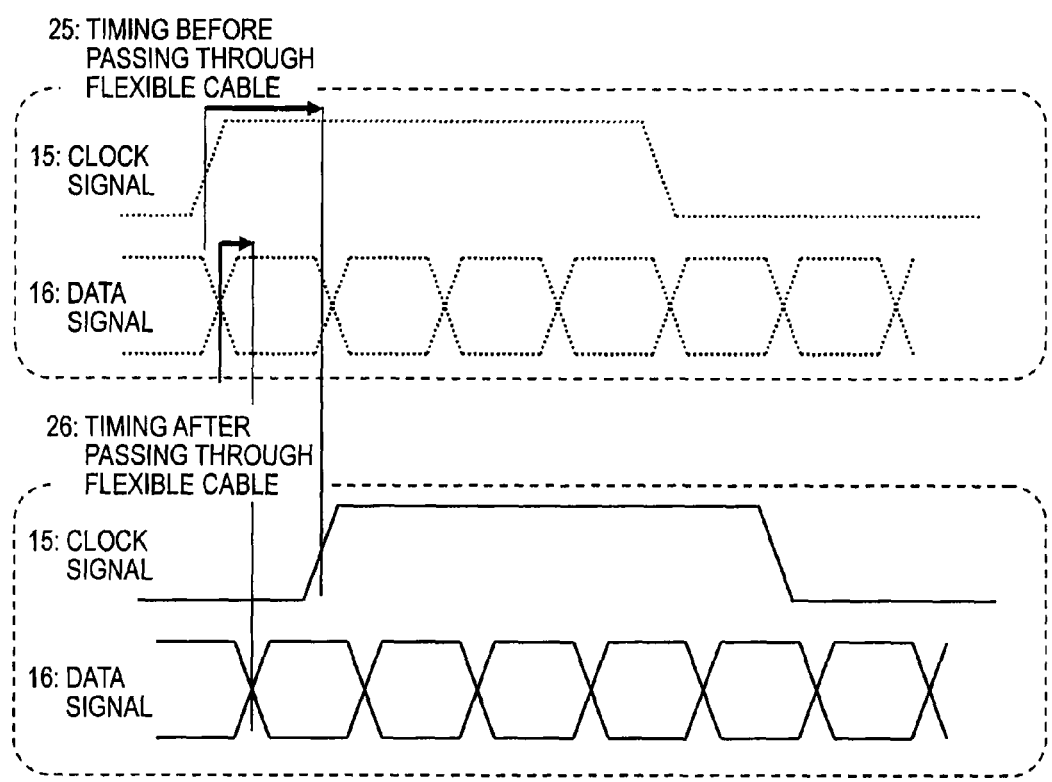
FIG. 8 is a diagram showing waveforms in delaying of a signal by the flexible cable according to the second embodiment of the invention.

In a case where the flexible cable 14 according to this embodiment is used, a difference in the transmission speed is generated between the differential clock signal wires 6b covered with the shield member 4, through which the clock signals pass and the differential data signal wires 6a not covered with the shield member 4, through which the data signals pass. Therefore, a relationship of timings of the clock signal 15 and the data signal 16 varies between before and after passing through the flexible cable 14 as shown in FIG. 8.

This is because that an impedance of the clock signal 15 passing through the signal wire covered with the shield member 4 is increased and the transmission speed is decreased as compared to the data signal 16 passing through the signal wire not covered with the shield member 4 so that an amount of delay is increased. Three units for adjusting the relationship of the timings is described below.

A first unit is configured such that the impedance network 20 is connected to a differential signal wire 22 and is adapted to perform adjusting of timing of a signal that arrives at the IC 19 as the signal reception section.

Figure 9:
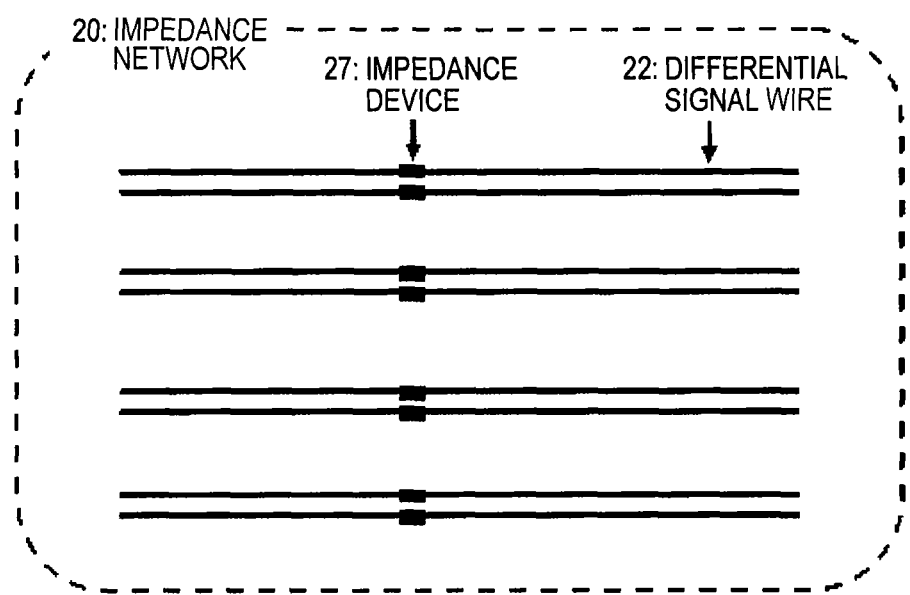
FIG. 9 is a configuration view showing an impedance network.

As shown in FIG. 9, in the unit, an impedance device 27 is connected to each of the differential signal wires 22 in series or in parallel at a portion just behind the IC 18 as the signal transmission section or just in front of the IC 19 as the signal reception section. Accordingly, when the impedance of each wire is changed and the transmission speed is adjusted, the timing of each signal is adjusted.

In this embodiment, the amount of delay of the clock signal 15 is increased as compared to the amount of delay of the data signal 16. Therefore, the impedance device 27 (a resistor in this embodiment) are respectively connected in serial to the differential data signal wires 6a through which the data signals 16 pass so that the timing of each data signal 16 is delayed by a degree of difference in the amount of delay between the clock signal 15 and the data signal 16.

Meanwhile, in the description of this embodiment, the impedance network is referred to as the resistor. However, the resistor can be replaced with another device including an impedance component.

A second unit is adapted to adjust a timing of outputting each signal from the IC 18 as the signal transmission section.

Figure 10:
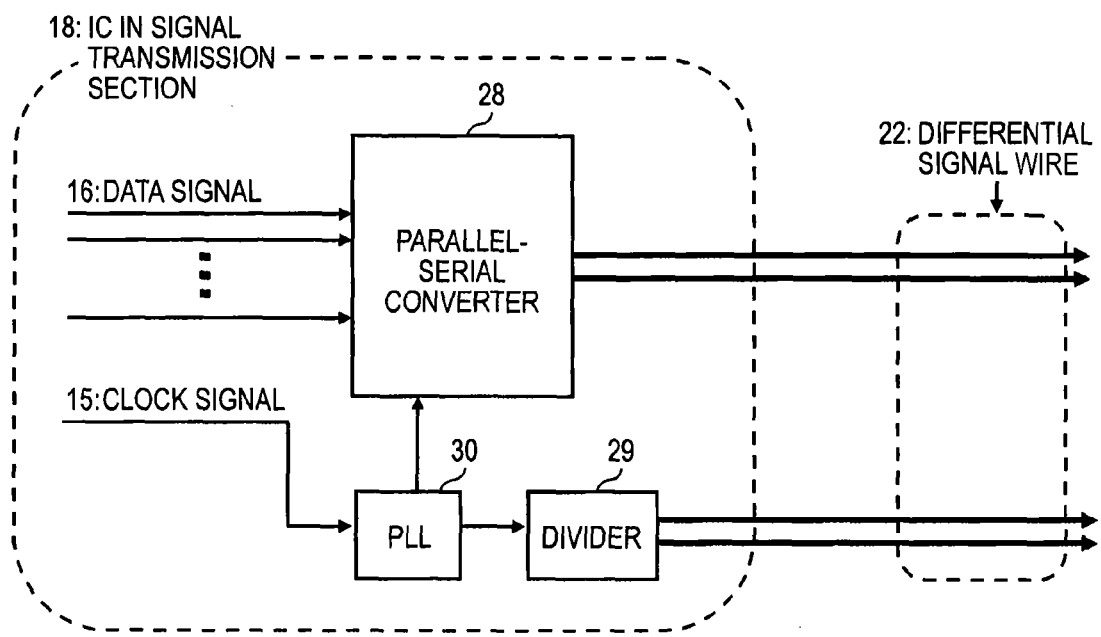
FIG. 10 is a schematic view showing an LVDS output section of an IC in a signal transmission section.

An output section of the LVDS of the IC 18 as the signal transmission section is schematically shown in FIG. 10. The data signal 16 is converted from a parallel signal into a serial signal by a parallel-serial converter 28 to be output, and the clock signal 15 is output via a PLL (Phase Lock Loop) 30 and a divider 29.

Figure 11:
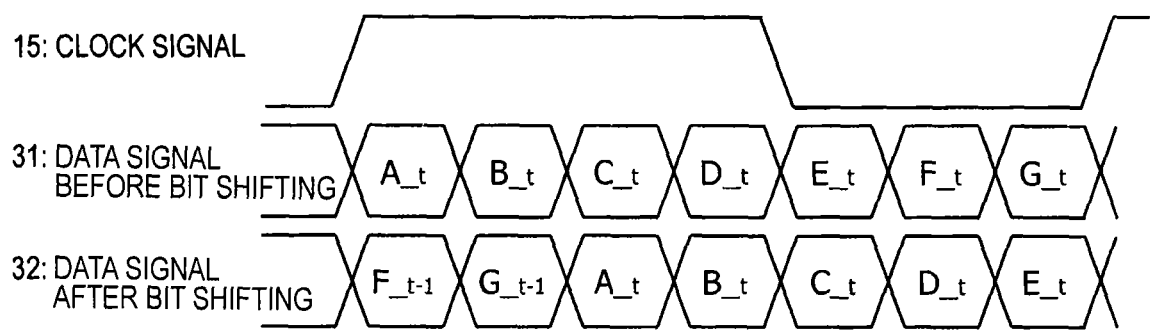
FIG. 11 is a diagram showing timings in bit-shifting.

When the data signal is converted by the parallel-serial converter 28, the data signal 16 is bit-shifted by the degree of difference in the amount of delay between the clock signal 15 and the data signal 16. Consequently, the signals can be output by deviating the timings thereof in advance as in a data signal 31 before bit-shifting and a data signal 32 after bit-shifting as shown in FIG. 11.

Figure 12:
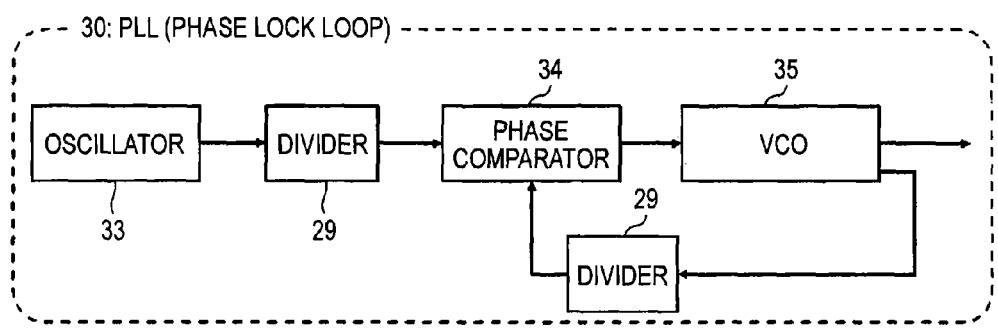
FIG. 12 is a configuration view showing a PLL.

Next, the PLL is described below. As shown in FIG. 12, the PLL 30 is configured to have an oscillator 33 as a reference, two dividers 29, a phase comparator 34 and a VCO (Voltage Controlled Oscillator) 35.

Figure 13:
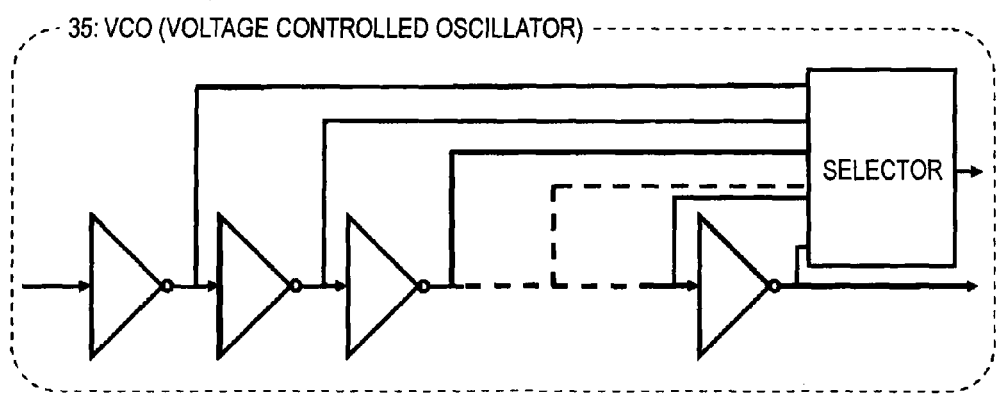
FIG. 13 is a configuration view showing a VCO.
Figure 14:
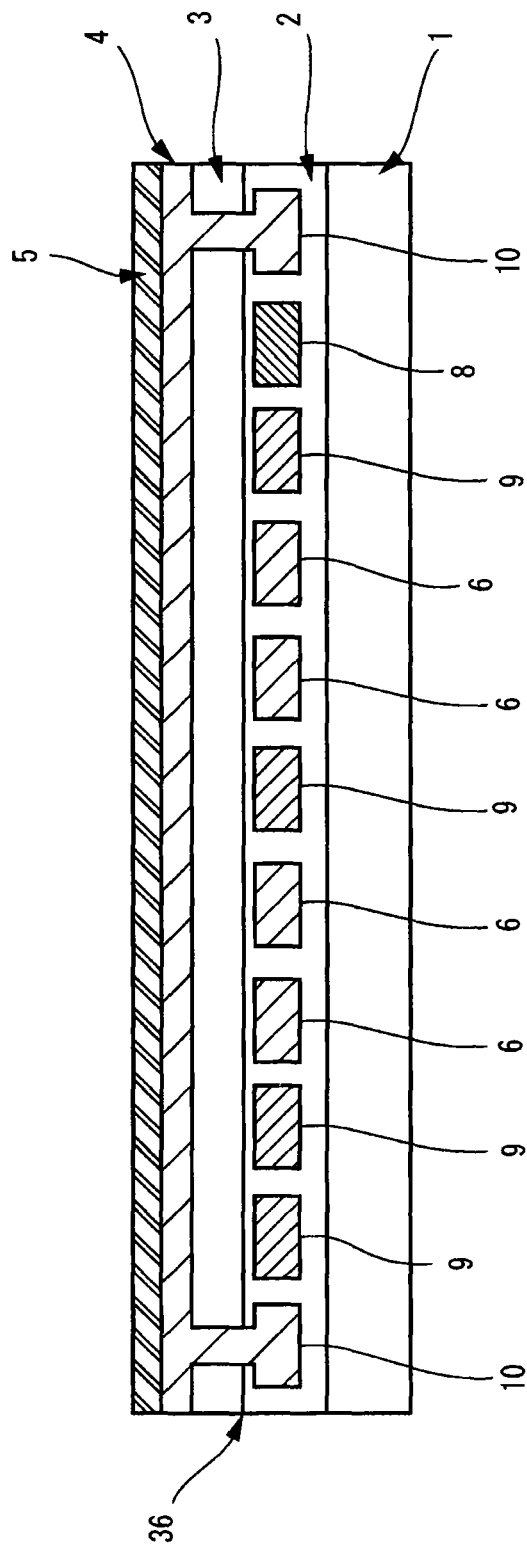
FIG. 14 is a cross sectional view showing a conventional flexible cable.

As shown in FIG. 13, the VCO 35 is configured to have several invertors. A signal passing through the invertors has a short delay between an input section and an output section.

The delay is utilized and the amount of delay is selected to output the clock signal so that it is possible to output the clock signal by delaying the timing of the clock signal beforehand.

In the embodiment, since the amount of delay of the clock signal 15 is increased as compared to the amount of delay of the data signal 16, bit-shifting is performed by a degree of the increased amount of delay so as to adjust the timing of outputting the data signal from the IC 18 as the signal transmission section. Further, the timing of outputting the clock signal from the IC 18 as the signal transmission section is adjusted by using the VCO 35. Consequently, the timings of outputting the clock signal 15 and the data signal 16 from the IC 18 as the signal transmission section are adjusted.

While the unit of adjusting the timing by combining the bit-shifting and the VCO 35 is described in the embodiment, the timing can be adjusted only by the bit-shifting or the VCO 35.

Meanwhile, the VCO 35 formed by combining the several invertors can be replaced with another buffer.

The third unit is adapted to adjust a timing of a signal arriving at the IC 19 as the signal reception section in accordance with a length of the signal wire connecting the IC 18 as the signal transmission section to the IC 19 as the signal reception section.

The timing can be adjusted by carrying out shortening of a length of a signal wire having a large amount of delay, carrying out lengthening of a length of a signal wire having a small amount of delay, or carrying out both of the shortening and the lengthening.

Namely, by shortening the length of the signal wire having the small amount of delay, lengthening the length of the signal wire having the large amount of delay, or shorting the length of the signal wire having the small amount of delay as well as lengthening the length of the signal wire having the large amount of delay, the arrival time of each signal to the IC 19 as the signal reception section can be adjusted. Consequently, the timing of each signal can be adjusted.

By using the transmission system 24 having one or more of units in the three units of respectively adjusting the timings, the IC 19 of the signal reception section can accurately receive each signal.

While the description is made in the above regarding the example of adjusting the deviation in timing due to the flexible cable 14, the invention can be applied to a deviation in timing due to an IC as the signal transmission section, an IC as the signal reception section, wires on a board, a connector or the like other than the flexible cable 14.

While the invention is described in detail by referring to the specific embodiment, it is understood by those of ordinary skill in the art that various modifications and changes can be made without departing from the sprit and scope of the invention.

This application is based on Japanese Patent Application (JP-2009-080964) filed on Mar. 30, 2009, the contents of which are incorporated herein by reference.

INDUSTRIAL APPLICABILITY

Thus, the flexible cable according to the invention makes it possible to satisfy both of ensuring of the adequate transmission characteristic in the high frequency band and suppression of electromagnetic noises to be radiated, and the invention is useful for the transmission and the transmission system with the use of the flexible cable in which the transmission characteristic and the electromagnetic noise characteristic are considered.

DESCRIPTION OF REFERENCE NUMERALS AND SIGNS 1 base member (dielectric substance)
2 adhesive (dielectric substance)
3 cover member (dielectric substance)
4 shield member
5 top coating member
6 differential signal wire
6a differential data signal wire
6b differential clock signal wire
7 differential signal wire group
8 low speed signal wire
9 ground wire
9a guard ground wire
10 shield ground wire
11 flexible cable
12 transmission characteristic of wiring without a shield member
13 transmission characteristic of wiring with a shield member
14 flexible cable
15 clock signal
16 data signal
17a, 17b connector
18 IC as a transmission section
19 IC as a reception section
20 impedance network
21 terminating resistor
22, 22a, 22b differential signal wire
23a transmission side printed board
23b reception side printed board
24 transmission system
25 timing before passing through the flexible cable
26 timing after passing through the flexible cable
27 impedance device
28 parallel-serial converter
29 divider
30 PLL
31 data signal before bit-shifting
32 data signal after bit-shifting
33 oscillator
34 phase comparator
35 VCO
36 flexible cable

The invention claimed is:

1. A flexible cable comprising:
a sheet-like dielectric substance;
first and second conductive wire groups provided in the sheet-like dielectric substance; and
a sheet-like shield member that is laminated on the sheet-like dielectric substance so as to cover the first conductive wire group and so as not to cover any of the second conductive wire group.

2. The flexible cable according to claim 1, wherein the second conductive wire group has a differential signal wire.

3. The flexible cable according to claim 1, wherein the first conductive wire group has a differential clock signal wire; and
wherein the second conductive wire group has a differential data signal wire.

4. A transmission system comprising:
a signal transmission section that transmits a differential signal;
a signal reception section that receives a differential signal; and
a flexible cable that connects the signal transmission section to the signal reception section,
wherein the flexible cable includes:
   a sheet-like dielectric substance;
   first and second conductive wire groups provided in the sheet-like dielectric substance; and
   a sheet-like shield member that is laminated on the sheet-like dielectric substance so as to cover the first conductive wire group and so as not to cover any of the second conductive wire group.

5. The transmission system according to claim 4, wherein the second conductive wire group has a differential signal wire.

6. The transmission system according to claim 4, wherein the first conductive wire group has a differential clock signal wire; and
wherein the second conductive wire group has a differential data signal wire.

7. The transmission system according to claim 6, wherein the signal transmission section or the signal reception section has a timing adjusting unit which delays the differential data signal by a resister connected thereto so as to adjust timings of the differential data signal and the differential clock signal.

8. The transmission system according to claim 6, wherein the signal transmission section has a timing adjusting unit which shifts bit of the differential data signal to adjust timings of the differential data signal and the differential clock signal.

* * * * *